United States Patent
Liu

(10) Patent No.: US 7,045,435 B1
(45) Date of Patent: May 16, 2006

(54) SHALLOW TRENCH ISOLATION METHOD FOR A SEMICONDUCTOR WAFER

(75) Inventor: Jacson Liu, Hsin-Chu Hsien (TW)

(73) Assignee: Mosel Vitelic Inc, Hsin-Chu (TW)

( * ) Notice: Subject to any disclaimer, the term of this patent is extended or adjusted under 35 U.S.C. 154(b) by 0 days.

(21) Appl. No.: 09/187,197

(22) Filed: Nov. 3, 1998

(51) Int. Cl.
 *H01L 21/76* (2006.01)

(52) U.S. Cl. ............... 438/427; 438/424; 438/439; 438/443; 438/444; 438/700

(58) Field of Classification Search ......... 438/424, 438/425, 426, 427, 435, 439, 443, 444, 700, 438/701; 257/506
See application file for complete search history.

(56) References Cited

U.S. PATENT DOCUMENTS

| | | | |
|---|---|---|---|
| 5,004,703 A * | 4/1991 | Zdebel et al. | 438/413 |
| 5,308,786 A * | 5/1994 | Lur et al. | 438/427 |
| 5,372,968 A * | 12/1994 | Lur et al. | 438/425 |
| 5,459,096 A * | 10/1995 | Venkatesan et al. | 438/437 |
| 5,492,858 A * | 2/1996 | Bose et al. | 438/437 |
| 5,498,565 A * | 3/1996 | Gocho et al. | 438/427 |
| 5,677,232 A * | 10/1997 | Kim et al. | 438/412 |
| 5,683,932 A * | 11/1997 | Bashir et al. | 438/427 |
| 5,688,720 A | 11/1997 | Hayashi | |
| 5,702,977 A | 12/1997 | Jang et al. | |
| 5,721,172 A * | 2/1998 | Jang et al. | 438/424 |
| 5,733,383 A | 3/1998 | Fazan et al. | |

OTHER PUBLICATIONS

1998 Symposium on VLSI Technology Digest of Technical Papers: p. 152-p. 153.

* cited by examiner

Primary Examiner—Maria F. Guerrero
(74) Attorney, Agent, or Firm—Winston Hsu

(57) ABSTRACT

The present invention relates to a shallow trench isolation method of a semiconductor wafer which fills dielectric material into shallow trenches between components on the surface of the semiconductor wafer to electrically isolate the components. This method can prevent dishing phenomenon from occurring over the surface of some wider shallow trenches when a chemical-mechanical polishing method is used to polish the surface of the dielectric material filled in each shallow trench. The method comprises: (1) choosing the shallow trenches with widths greater than a predetermined size and generating at least one dummy in each chosen shallow trench to form a plurality of new trenches with widths less than the predetermined size; (2) covering the surface of the semiconductor wafer with dielectric material to form a dielectric layer; (3) condensing the dielectric layer; (4) polishing the surface of the dielectric layer filled in all the shallow trenches to align the surface of the dielectric material with the surface of the components on the semiconductor wafer.

12 Claims, 17 Drawing Sheets

SHALLOW TRENCH ISOLATION METHOD FOR A SEMICONDUCTOR WAFER

BACKGROUND OF THE INVENTION

1. Field of the Invention

The present invention relates to a shallow trench isolation method for a semiconductor wafer.

2. Description of the Prior Art

Each MOS transistor component on a semiconductor wafer must be well isolated from neighboring components to prevent interference or short circuiting. In general, localized oxidation isolation (LOCOS) and shallow trench isolation methods are used for isolating the MOS transistors within the semiconductor wafer. Using the LOCOS method a $SiO_2$ layer (field oxide layer) is formed with an intra-transistor distance of several thousand angstroms by oxidizing the Si substrate of a semiconductor wafer at a high temperature. However, there are always crystal defects associated with generating a field oxide layer with the LOCOS method which include a bird's beak deformity that can affect neighboring components and destroy the integrity of the integrated circuit.

At present, the most commonly used isolation method for isolating MOS transistors in semiconductor processing less than 0.25 μm is shallow trench isolation. Although this method effectively achieves electrical isolation by filling dielectric material in the shallow trench between any two neighboring components within the semiconductor wafer, there is still a possibility of the "dishing" phenomenon occurring on the surface of shallow trench. This may affect the electrical performance of the semiconductor wafer. Please refer to FIGS. 1 to 6. FIGS. 1 to 6 show the prior art shallow trench isolation method for a semiconductor wafer. As shown in FIG. 1, a semiconductor wafer 10 comprises a Si substrate 14, a pad oxide layer 16 formed over the Si substrate 14, and a pad nitride layer 18 deposited above the pad oxide layer 16. The pad oxide layer 16 and pad nitride layer 18 are used as a mask or sacrificial layer during the ion implantation or heat diffusion process which is followed by photolithography and etching to form a plurality of shallow trenches 12 on the surface of the semiconductor wafer 10.

Afterwards, chemical vapor deposition (CVD) is performed to deposit a $Si(OC_2H_5)_4$ (tetra-ethyl-ortho-silicate TEOS) layer and a Poly-Silicon layer in the proper order. As shown in FIG. 2, the TEOS layer 20 covers the entire surface of the semiconductor wafer 10 and is used as a dielectric layer, and the Poly-Silicon layer 22 is used as a mask.

At this point, the unnecessary parts of the Poly-Silicon layer 22 are eliminated and the surface of the semiconductor wafer 10 is polished by chemical mechanical polishing (CMP). As shown in FIG. 3, the Poly-Silicon 24 in the overlying dishes above the corresponding shallow trenches 12 remain. This makes the surface of the semiconductor wafer 10 flat.

Please refer to FIG. 4. The Poly-Silicon 24 and TEOS layer 20 remaining on the surface of the semiconductor wafer 10 is etched with reactive ion etching or magnetically enhanced reactive ion etching techniques. The Poly-Silicon 24 remaining after this procedure serves as a mask over the shallow trench 12. After etching, several remaining overhangs 26 are formed above the shallow trenches 12. The remaining TEOS layer 20 and several overhangs 26 are then adjusted to form a tighter structure of solid $SiO_2$.

CMP is performed to eliminate the remaining overhangs 26 and to polish the surface of the semiconductor wafer 10 making it flat as shown in FIG. 5. Finally, the pad oxide layer 16 and pad nitride layer 18 are stripped by etching. As shown in FIG. 6, only Si substrate 14 and several shallow trenches 12 of TEOS remain on the surface of semiconductor wafer 10.

When performing CMP and back etching shown in FIG. 5 and FIG. 6, the overhangs 26 do not work perfectly as masks; therefore, the surface of TEOS in the shallow trench 12 becomes etched. If the shallow trench 12 is big, the surface of TEOS etched is big, and a dish 28 is generated on the surface. The wider the surface, the more severe the dishing which can affect the semiconductor wafer 10. Also, when depositing the film layer, a focusing problem will occur when transferring patterns.

SUMMARY OF THE INVENTION

It is therefore a primary objective of the present invention to provide a shallow trench isolation method of a semiconductor wafer where dishing does not occur to solve the above mentioned problem.

In a preferred embodiment, the present invention relates to a method for electrically isolating shallow trenches between components on the surface of a semiconductor wafer comprising:

choosing shallow trenches with widths greater than a predetermined size on the surface of the semiconductor wafer and generating at least one dummy in each chosen shallow trench to form a plurality of new shallow trenches with widths less than the predetermined size;

forming a dielectric layer over the surface of the semiconductor wafer, wherein the dielectric material of the dielectric layer fills each shallow trench on the surface of the semiconductor wafer; condensing the dielectric layer; and performing a planarization process to polish the surface of the semiconductor wafer for aligning the surface of the dielectric layer inside each shallow trench with the surface of each component on the semiconductor wafer.

It is an advantage of the present invention that there is no dishing so the semiconductor wafer will not be affected electrically and there will be no focusing problems when transferring patterns.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
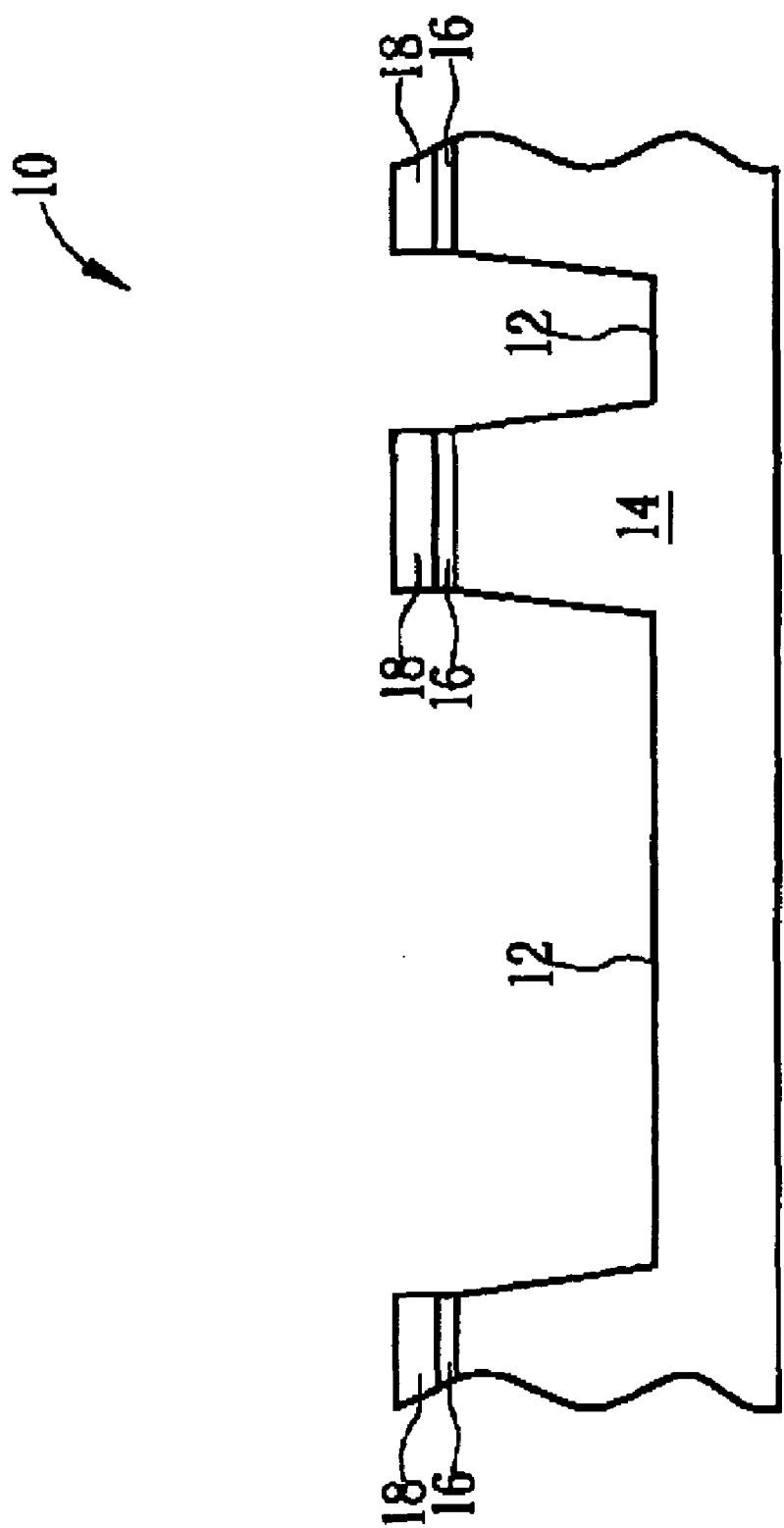
FIG. 1 to FIG. 6 show the prior art shallow trench isolation method of a semiconductor wafer.
Figure 2:
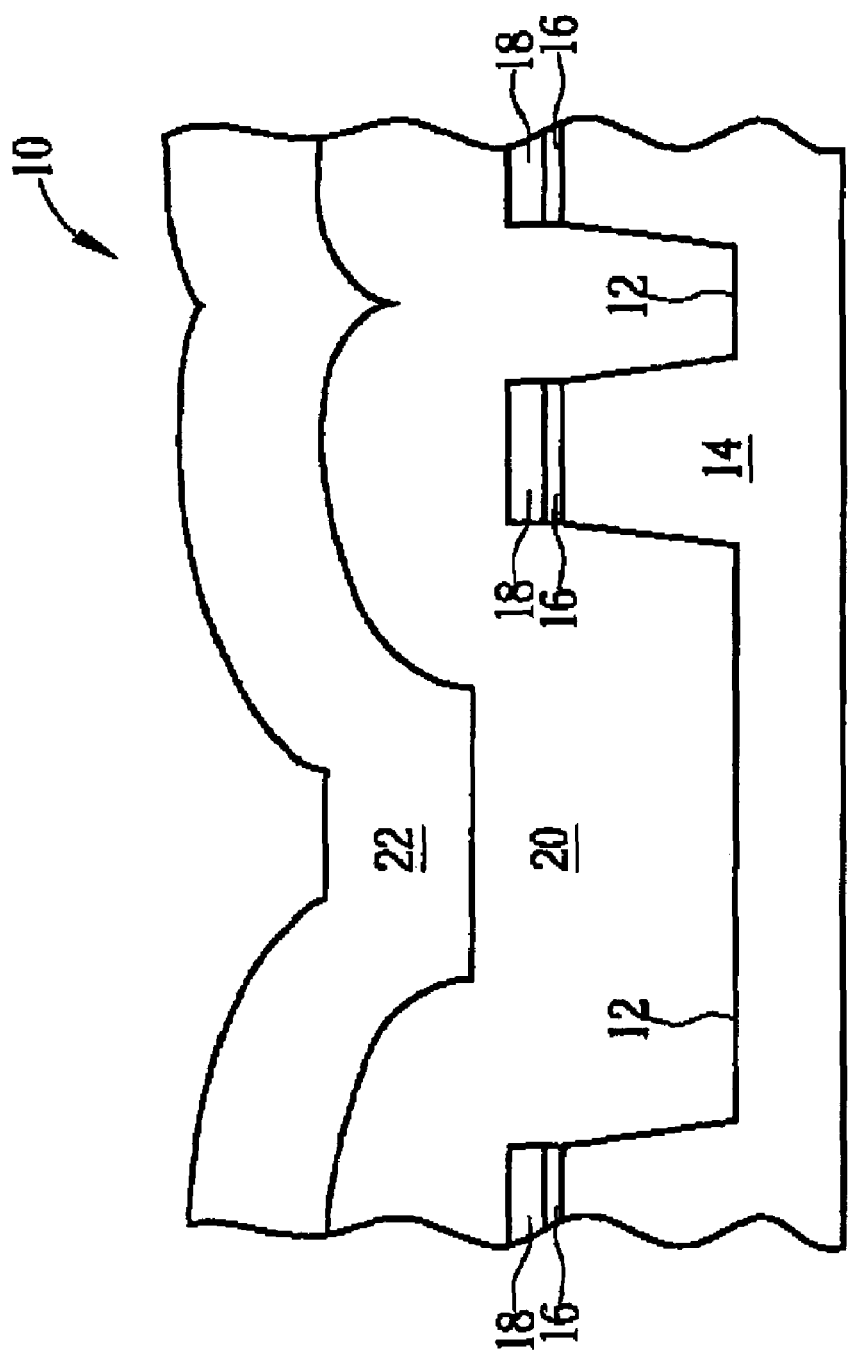
Figure 3:
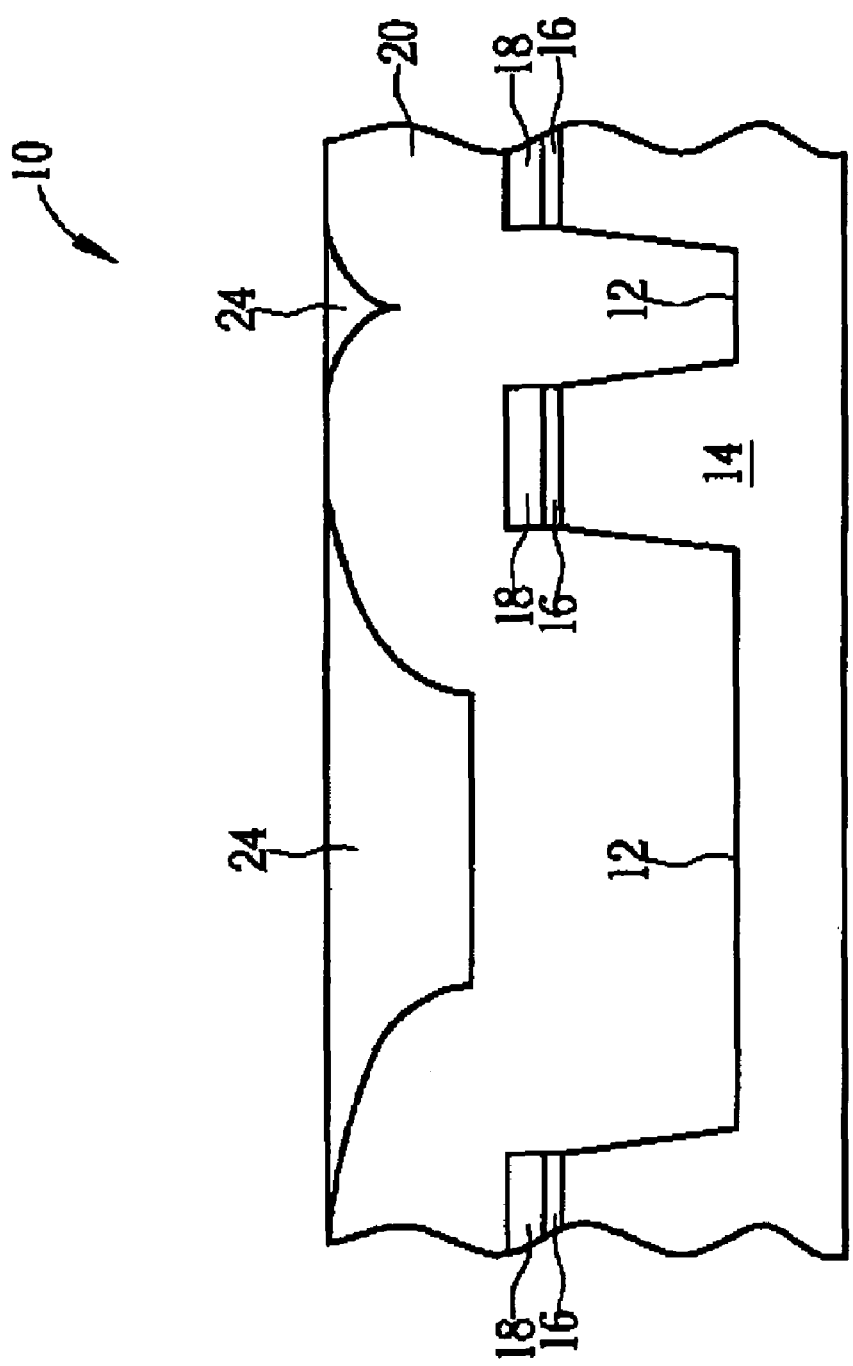
Figure 4:
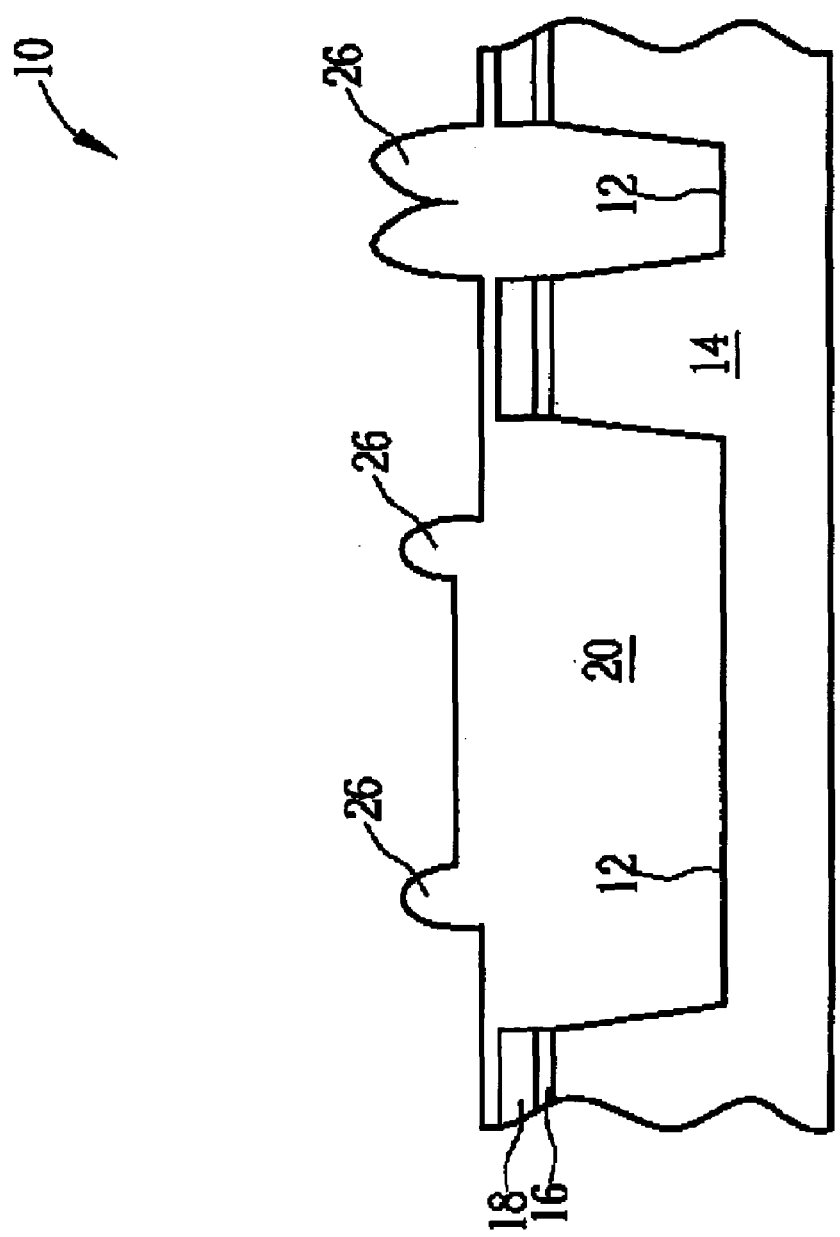
Figure 5:
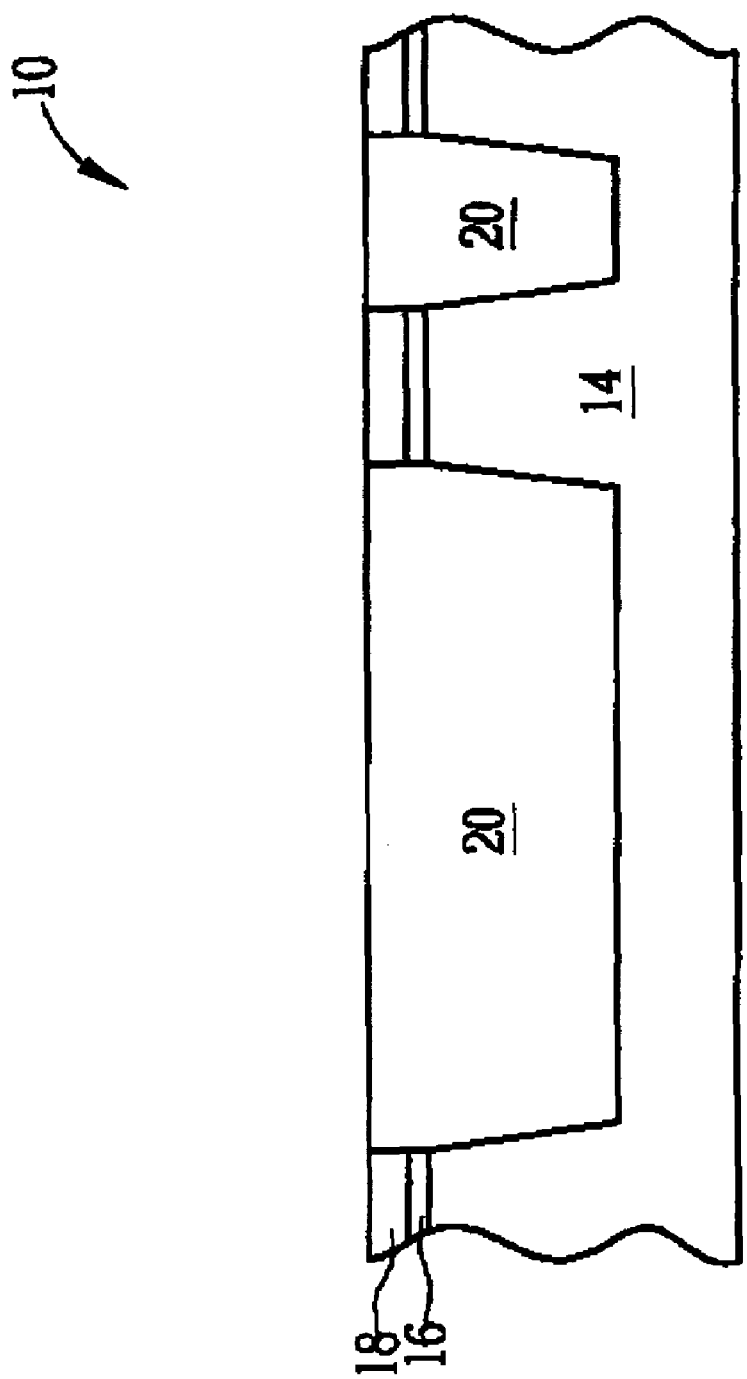
Figure 6:
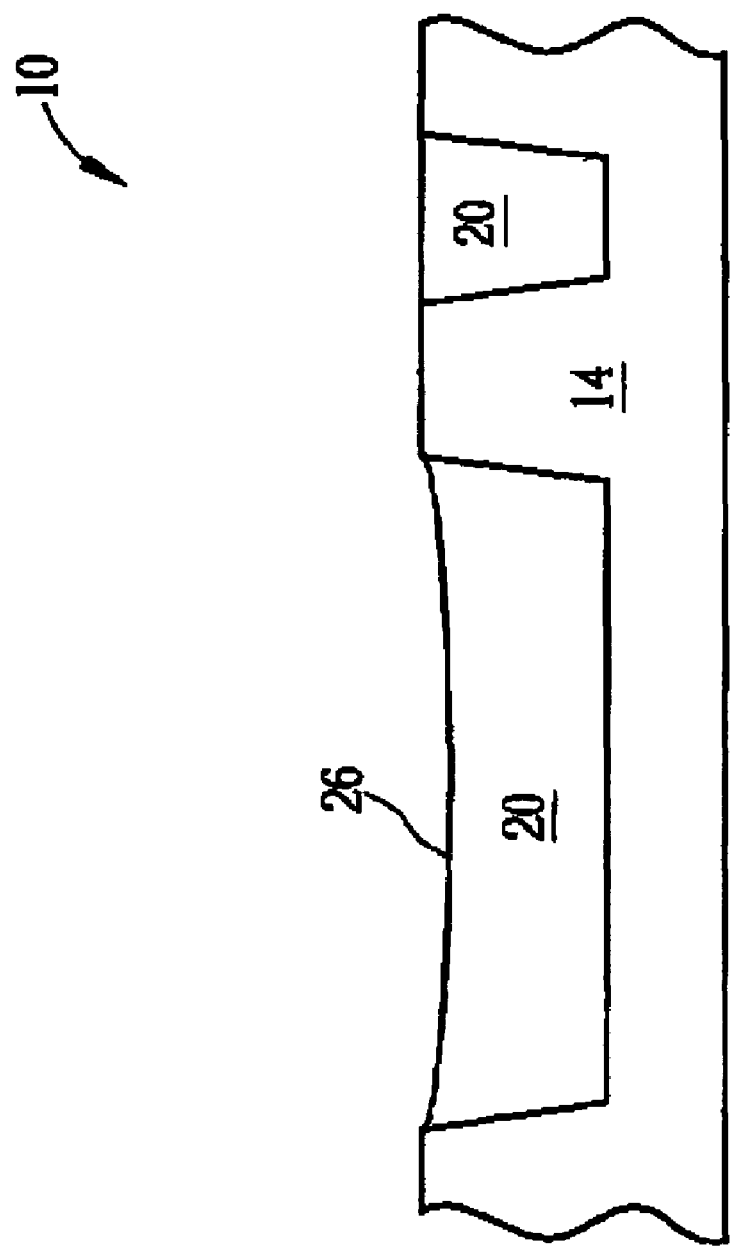
Figure 7:
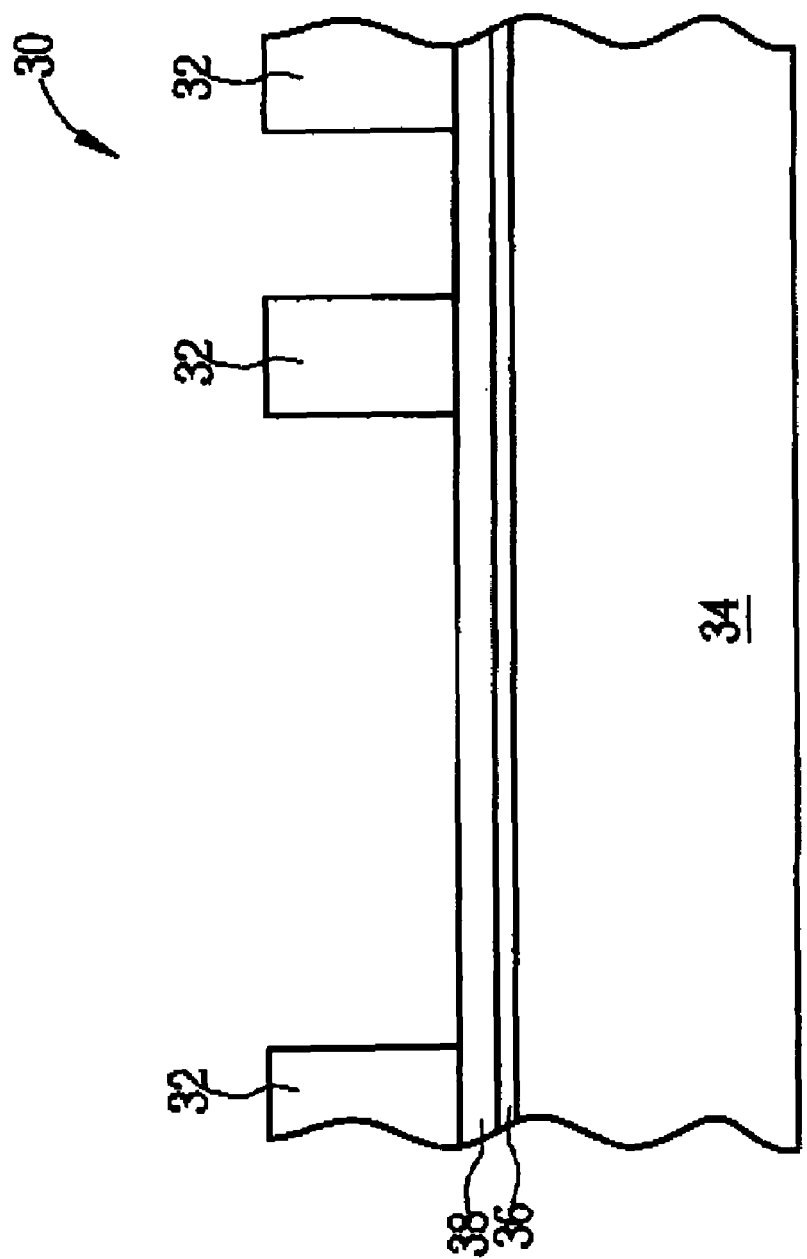
FIG. 7 to FIG. 11 show a method of forming dummies according to the present invention.
Figure 8:
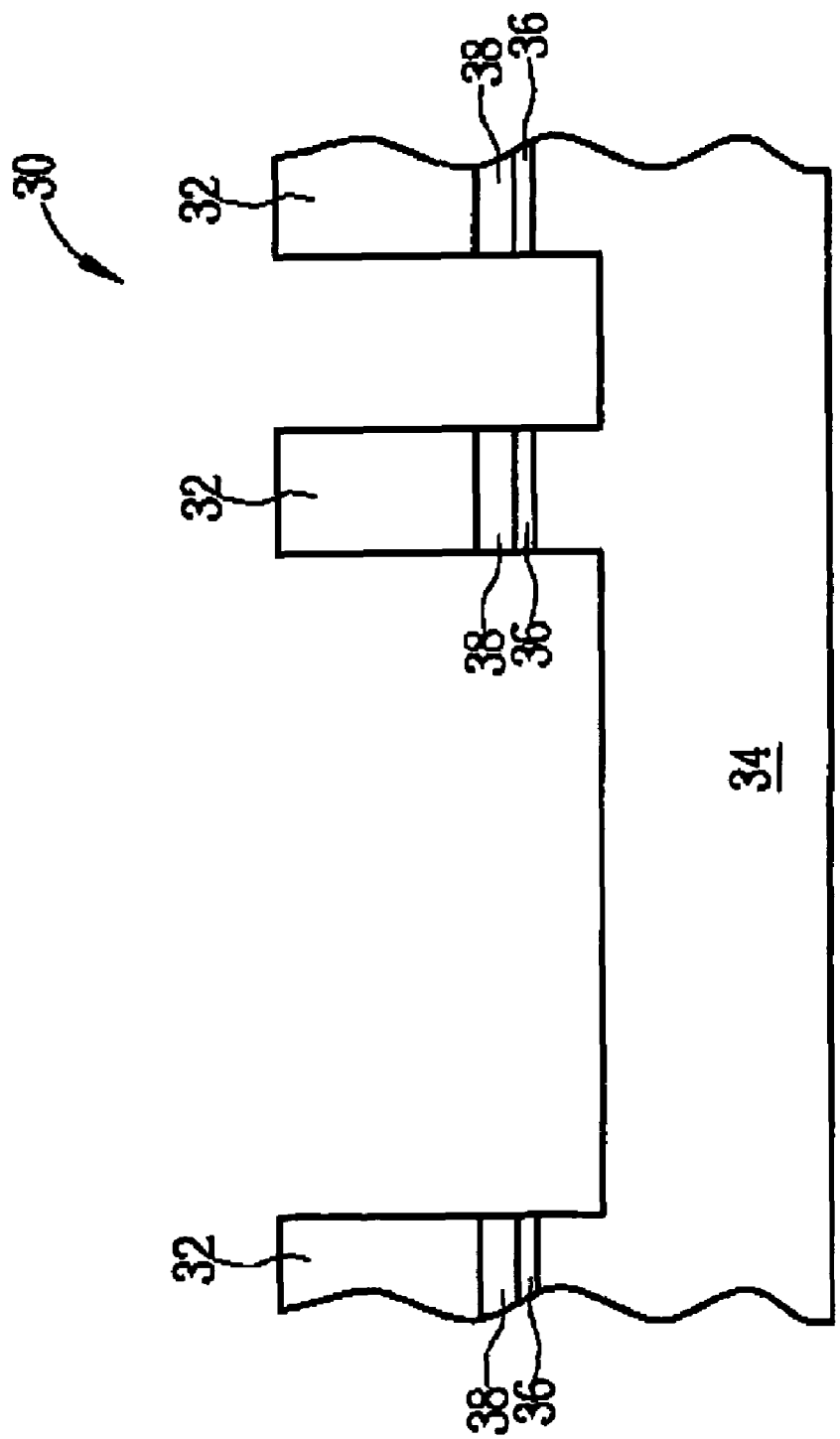

The present invention relates to a shallow trench isolation method of a semiconductor wafer. The method involves first separating large shallow trenches into multiple trenches of smaller width by generating several dummies followed by filling the shallow trenches with dielectric material. Please refer to FIG. 7 to FIG. 11. FIG. 7 to FIG. 11 show a method of forming dummies according to the present invention. As shown in FIG. 7, a semiconductor wafer 30 comprises a Si substrate 34, a pad oxide layer 36 composed of $SiO_2$ formed over the Si substrate 34, and a pad nitride layer 38 composed of $Si_3N_4$ deposited over the pad oxide layer 36. First, shallow isolation trenches are formed on the semiconductor wafer 30. Shallow trenches with widths greater than about 2 μm are used for generating dummies. A plurality of photoresists 32 are applied on the surface of the semiconductor wafer 30 to determine the positions of the shallow trenches by performing photolithography and etching. Then, the surface of the semiconductor wafer 30 is etched. As shown in FIG. 8, the pad oxide layers 36 and pad nitride layers 38 not covered by photoresists 32 are etched to the Si substrate 34.

Figure 9:
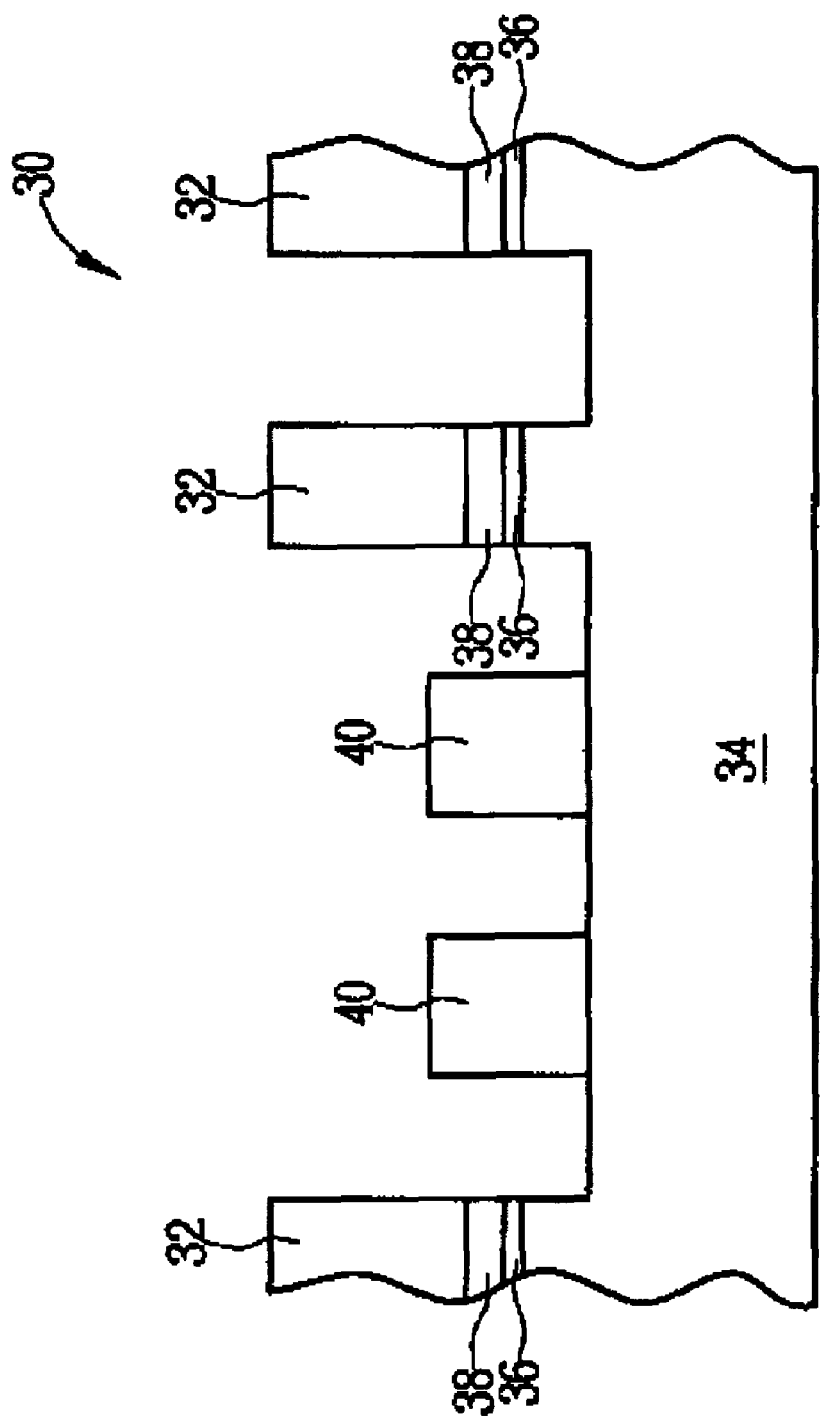
Figure 10:
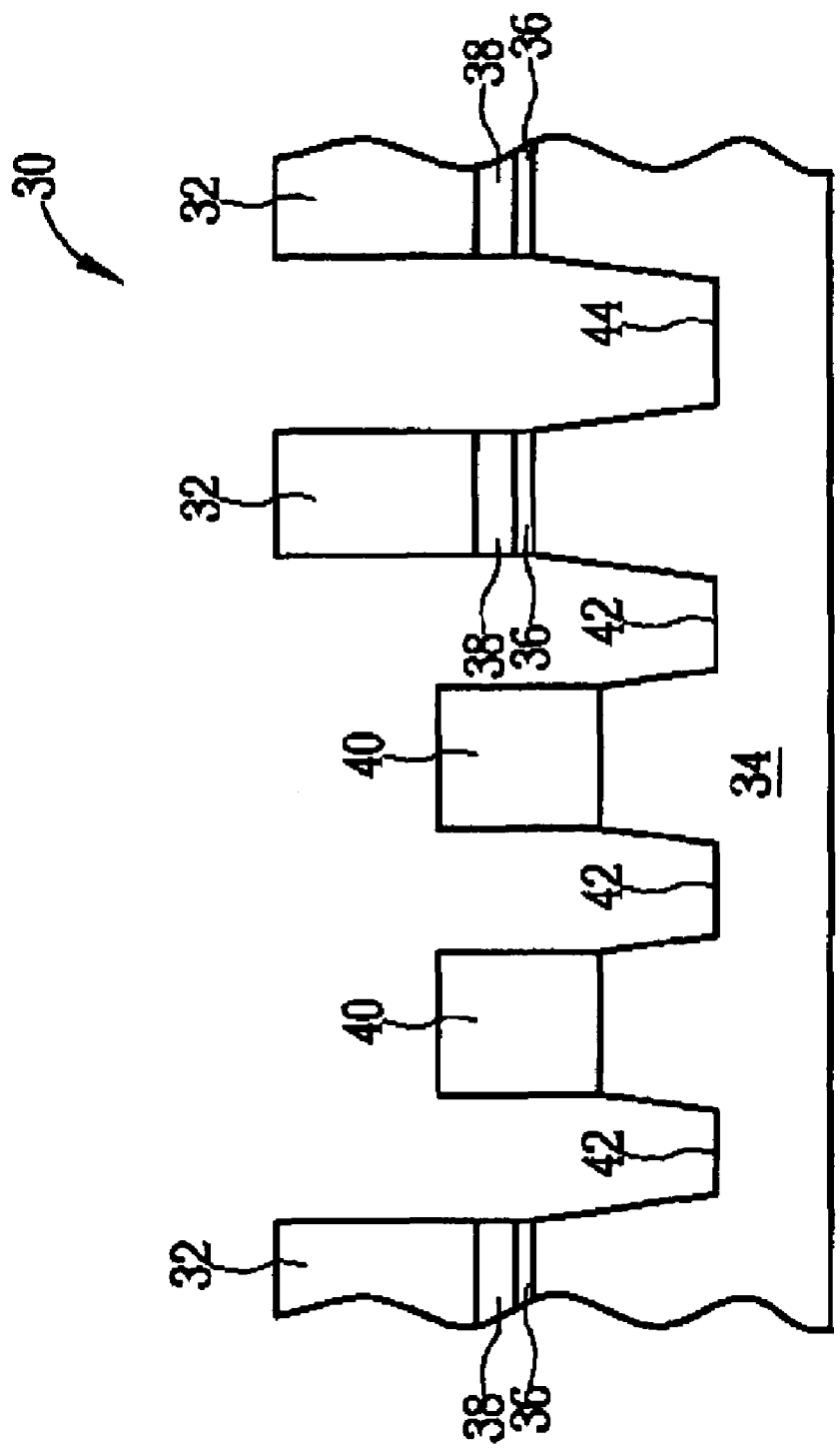
Figure 11:
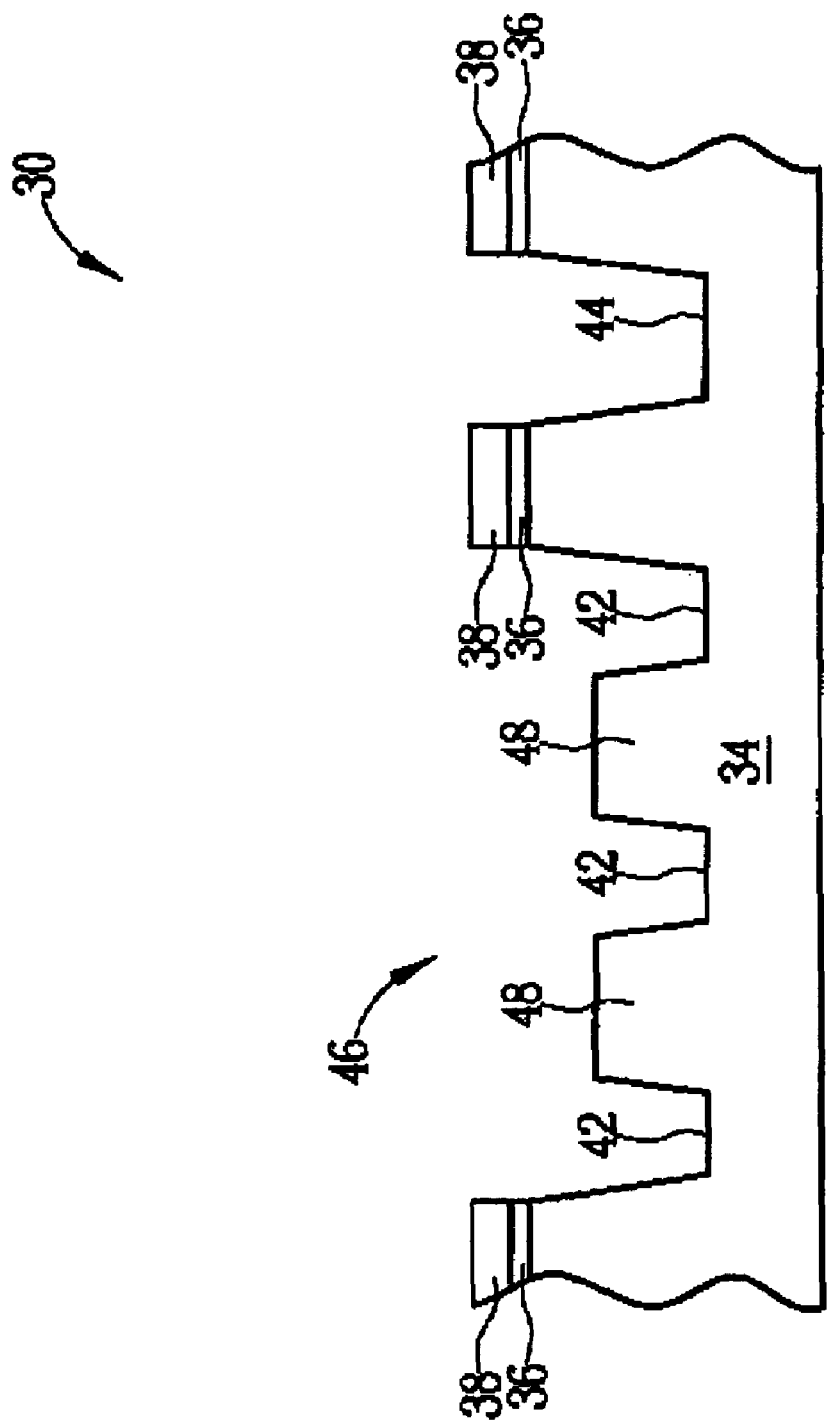

As shown in FIG. 9, photolithography and etching are used to place several photoresists 40 at a uniform distance on the surface of the Si substrate 34. Then, the surface of the Si substrate 34 not covered by photoresists 40 is etched. As shown in FIG. 10, several small shallow trenches 42, 44 are formed on the surface of the Si substrate 34. Finally, all photoresists 32 on the surface of the semiconductor wafer 30 are etched. As shown in FIG. 11, a small shallow trench 44 and a big shallow trench 46 are formed on the surface of the semiconductor wafer 30, and the shallow trench 46 is separated into several small shallow trenches 42 separated by a uniform distance by several dummies 48. In addition, the preferred height of the dummy is around 300 Å to 500 Å.

Figure 12:
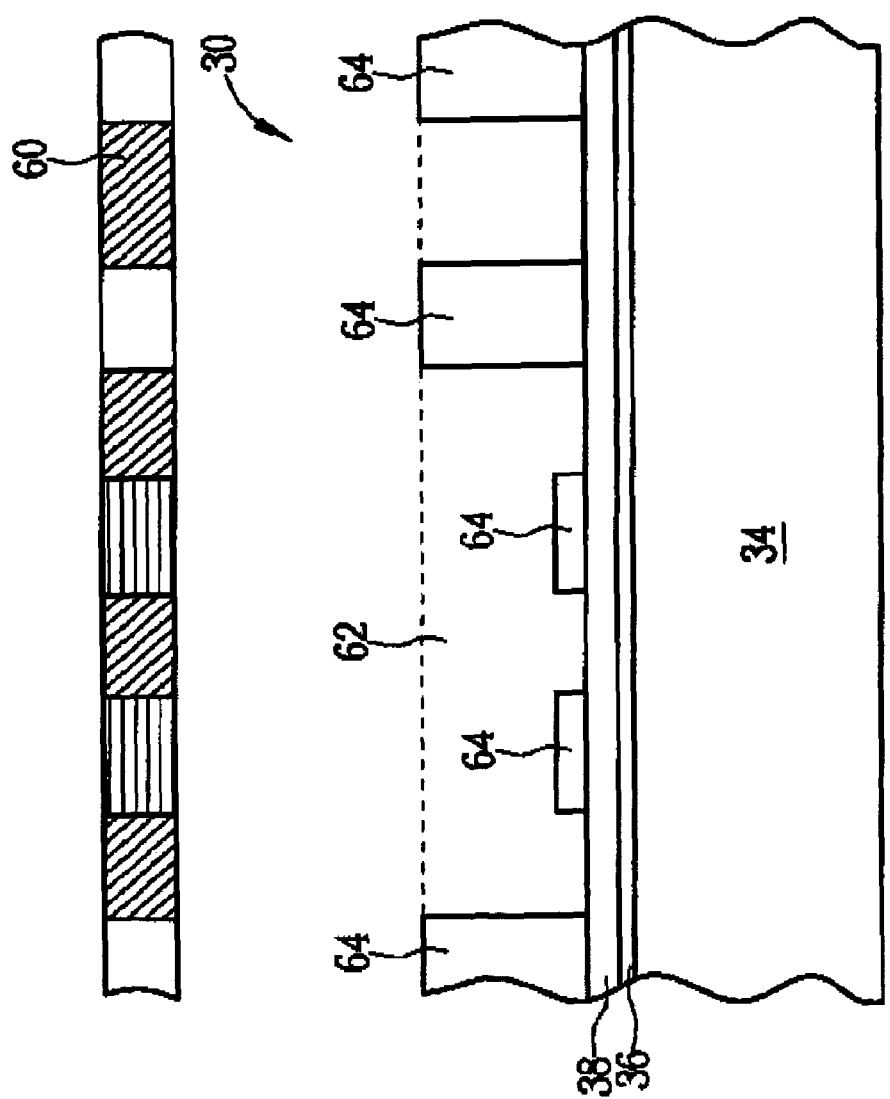
FIG. 12 to FIG. 14 show another method of forming dummies according to the present invention.

Also, because of different degrees of exposure (the areas on the optical mask with different light penetration capability), a plurality of dummies is generated at the bottom of the chosen shallow trenches at the time the shallow trenches are first formed. Please refer to FIG. 12. FIG. 12 shows the second method of forming dummies according to the present invention. In this scheme, one mask photo is used to place an optical mask 60 above the semiconductor wafer 30 and to expose and transfer patterns by using different light penetration capability on the optical mask 60. The surface of the semiconductor water 30 comprises a Si substrate 34, a pad oxide layer 36, a pad nitride layer 38 and a negative photoresist layer 62. The optical mask 60 comprises a plurality of areas (the space parts) of which the light penetration capability is 100%, a plurality of areas (the parts with oblique lines) of which the light penetration capability is 0% and a plurality of areas (the parts with horizontal lines) of which the light penetration capability is between 0% to 100%; therefore, the corresponding photoresists 64 are either completely dissolved, not dissolved at all or partly dissolved on the negative photoresist layer 62 of semiconductor wafer 30 and used as masks Thus, after etching is repeated, the semiconductor wafer 30 with a plurality of dummies and shallow trenches, as shown in FIG. 11, is made.

Figure 13:
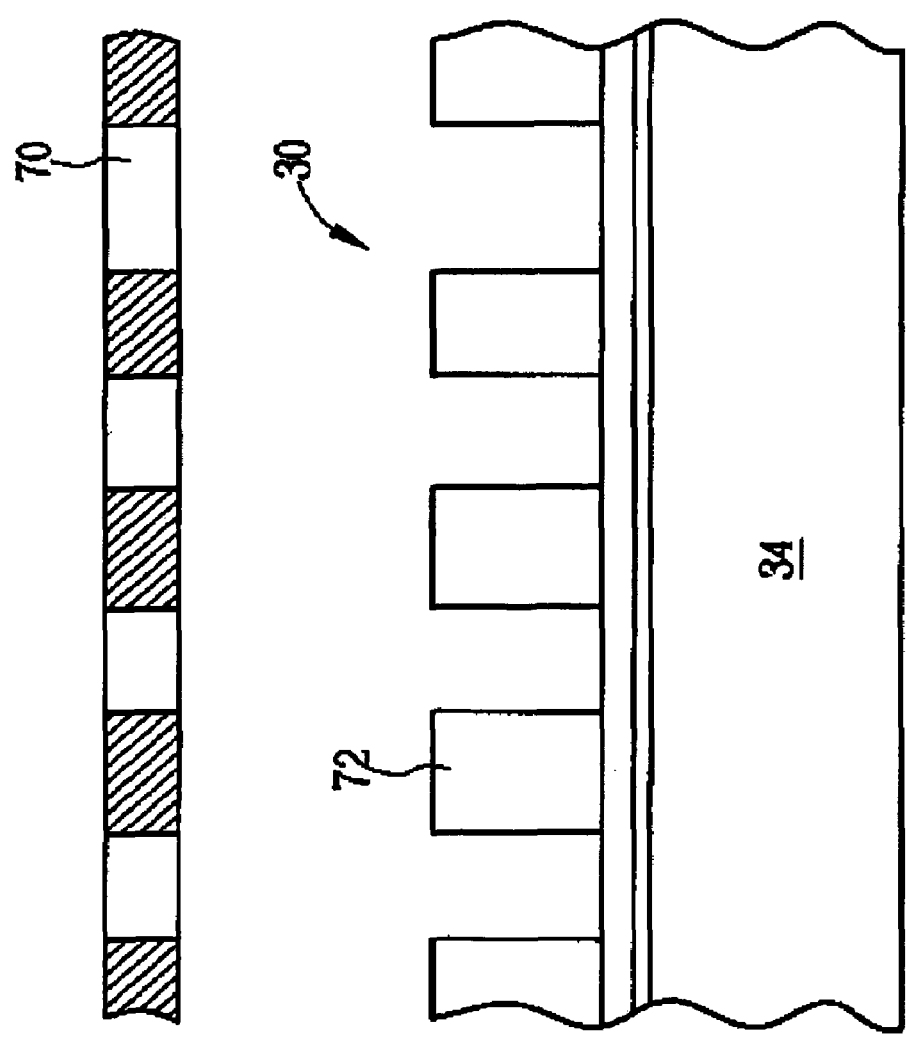
Figure 14:
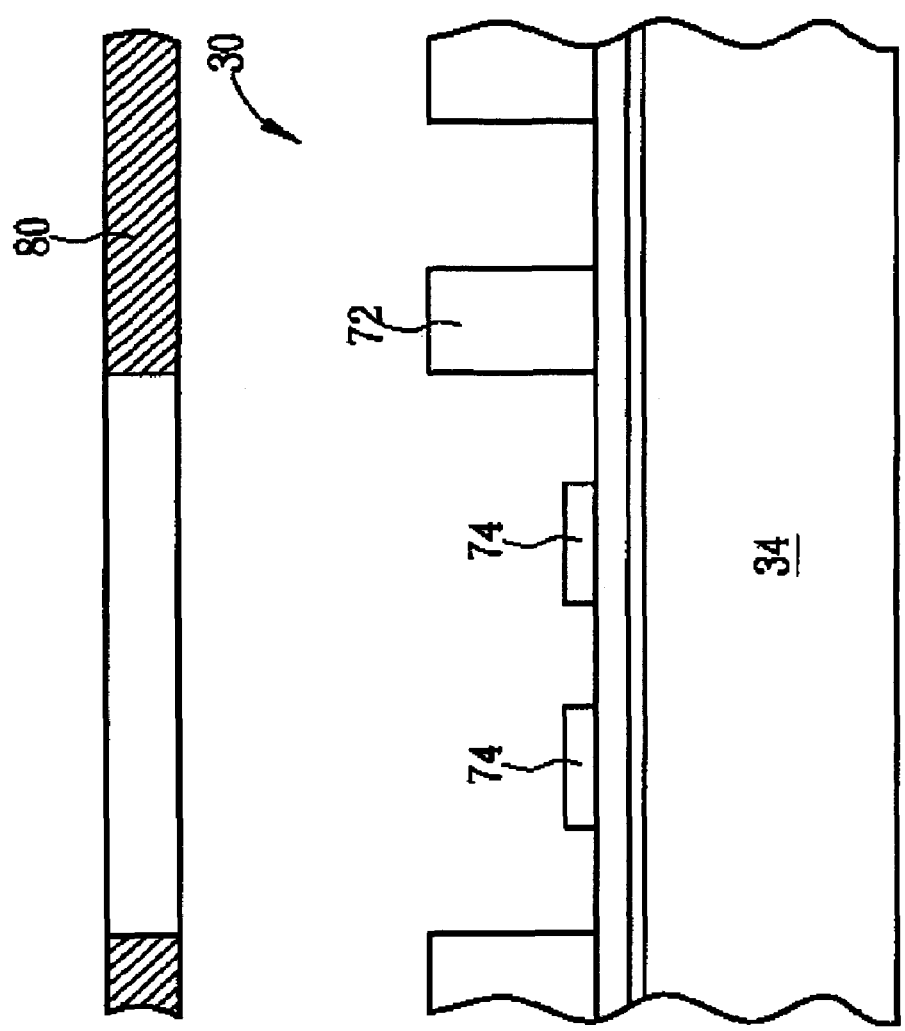

Please refer to FIG. 13 and FIG. 14. FIG. 13 and FIG. 14 show the third method of forming dummies according to the present invention and is similar with the second method shown in FIG. 12. In the third method, a plurality of photoresists 72 is generated by exposing with different degrees of decomposition on the semiconductor wafer 30 twice. Three groups of photoresists 72, completely dissolved, undissolved and partly dissolved, are formed on the surface of semiconductor wafer 30 and are used as masks when etching. As shown in FIG. 13, the method requires being exposed twice. First, a plurality of undissolved photoresists 72 are applied to the surface of semiconductor wafer 30 by using an optical mask 70 with areas with light penetration capability of 100% (the space parts) and areas with light penetration capability of 0% (the parts with oblique lines). Next, the photoresists 74 that determine the positions of dummies and new shallow trenches are partly dissolved by using another optical mask 80 (as shown FIG. 14) comprising both areas with light penetration capability of 100% (the space parts) and 0% (the parts with oblique lines). After etching, the semiconductor wafer 30 with a plurality of dummies and shallow trenches as shown in FIG. 11 is made.

Figure 15:
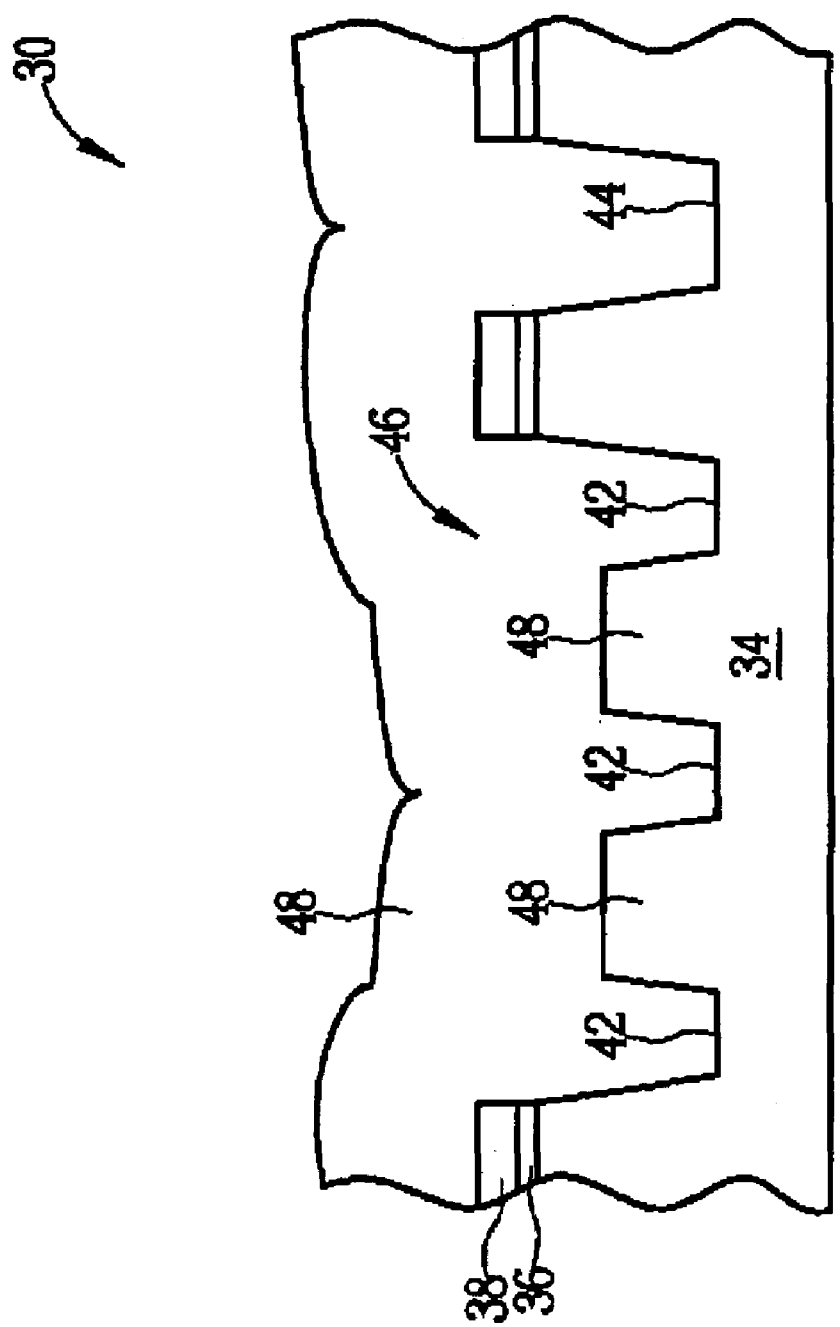
FIG. 15 to FIG. 17 show a shallow trench isolation method of a semiconductor wafer according to the present invention.
Figure 16:
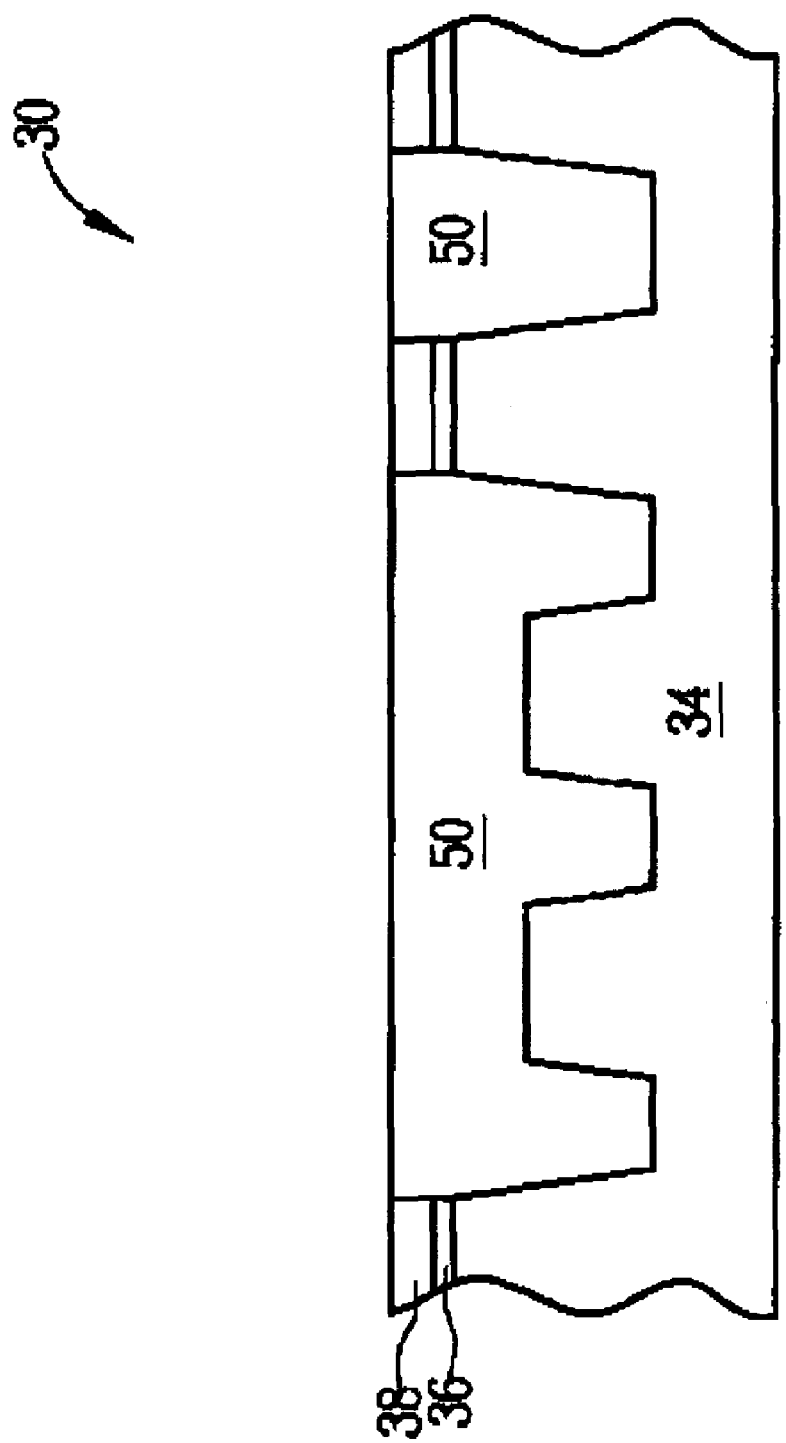
Figure 17:
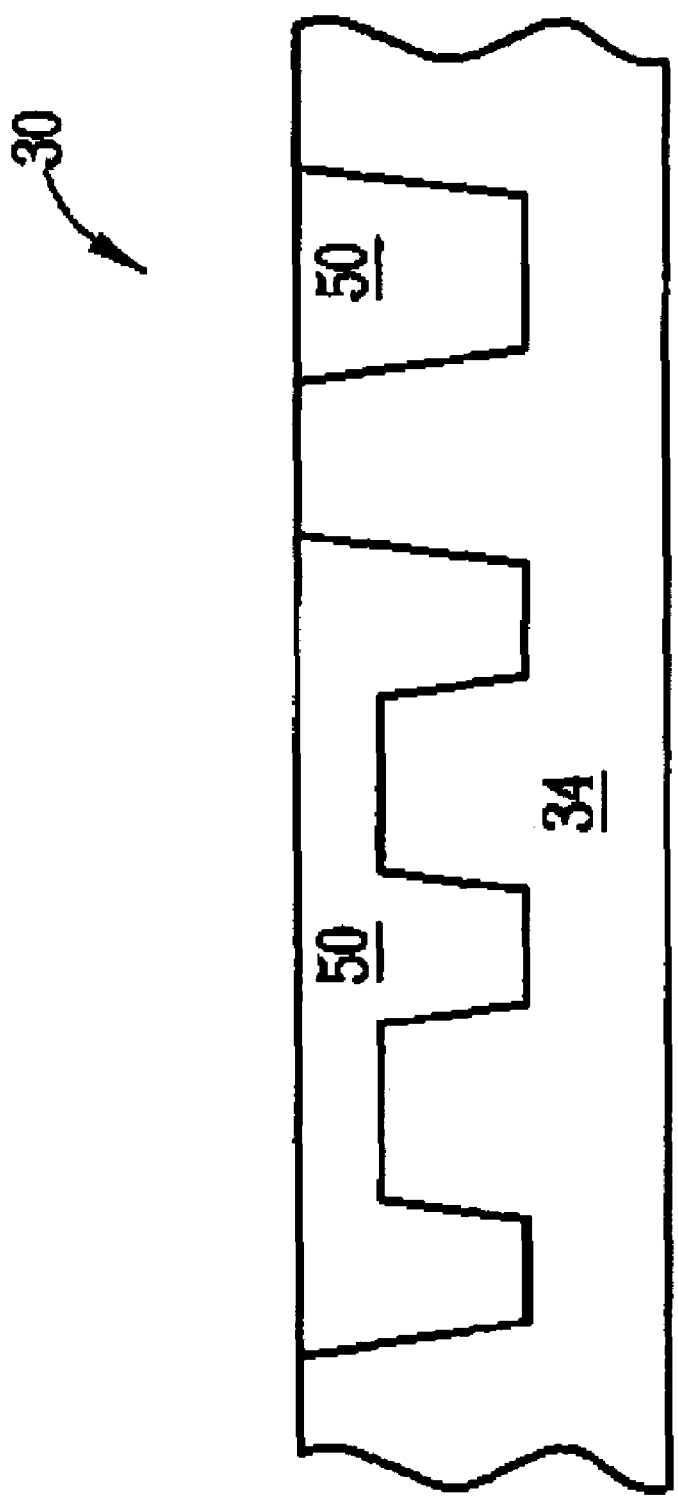

Please refer to FIGS. 15 to 17. FIGS. 15 to 17 show a shallow trench isolation method of a semiconductor wafer according to the present invention. After the dummies 48 and small shallow trenches are formed, a TEOS layer 50 is deposited over the surface of the semiconductor wafer 30 by performing CVD. The atoms in the TEOS layer 50 are rearranged by annealing to reduce the defect density of the TEOS layer 50 and to tighten the structure of $SiO_2$. When a plurality of dummies 48 are filled in the big shallow trench 46, the difference between the length of the TEOS layer 50 deposited over the big shallow trench 46 and the length of the TEOS layer 50 deposited over the other parts of the surface of the semiconductor wafer 30 is reduced. Therefore, the TEOS layer 50 deposited over the surface of the semiconductor wafer 30 is a flat surface.

After tightening the TEOS layer 50, the surface of semiconductor wafer 30 is polished by performing CMP. FIG. 16 shows polishing of the surface of the pad nitride layers 38 of the semiconductor wafer 30. Finally, the pad oxide layers 36 and pad nitride layers 38 are etched. As shown in FIG. 17, only Si substrate 34 and several shallow trenches 42 comprising TEOS are on the surface of semiconductor wafer 30 which is an intact plane, and the dishing on the surface of TEOS in each shallow trench 42 can be avoided.

Compared with the prior art, the shallow trench isolation method according to the present invention is to first generate several dummies in the bigger shallow trenches to separate the bigger shallow trenches into several shallow trenches with smaller widths to make the surface of the TEOS layer 50 deposited over the surface of the semiconductor wafer 30 flat. At the same time, the TEOS layer 50 is directly annealed without performing reactive ion etching or magnetically enhanced reactive ion etching. The result is an intact plane as the surface of the semiconductor wafer 30. Without dishing, the semiconductor wafer 30 will not be affected electrically and there will be no focusing problems when transferring patterns.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for electrically isolating shallow trenches between components on the surface of a semiconductor wafer comprising:

(a) forming a plurality of first-type trenches and second-type trenches on a semiconductor substrate, each of the first-type trenches having a width greater than a predetermined size that is greater than a width of each of the second-type trenches;

(b) performing a photolithographic process to form at least one photoresist pattern in each of the first-type trenches;

(c) performing an etching process to form at least one dummy and a plurality of third-type trenches in each of the first-type trenches with the photoresist patterns as masks, and to deepen each of the second-type trenches;

(d) stripping the photoresist patterns;

(e) forming a dielectric layer over the surface of the semiconductor wafer, wherein the dielectric material of the dielectric layer fills the first-type trenches, the second-type trenches, and the third-type trenches on the surface of the semiconductor wafer;

(f) condensing the dielectric layer; and (g) performing a planarization process to polish the surface of the semiconductor wafer for aligning the surface of the dielectric layer inside each of the first-type trenches and the second-type trenches with the surface of each component on the semiconductor wafer.

2. The shallow trench isolation method of claim 1 wherein the predetermined size is about 2 μm.

3. The shallow trench isolation method of claim 1 wherein the preferred height of any dummy is around 300 Å to 500 Å.

4. The shallow trench isolation method of claim 1 wherein the planarization process performed on the dielectric layer surface is a chemical mechanical polishing process.

5. The shallow trench isolation method of claim 1 wherein the dielectric layer is condensed by using an annealing process.

6. The shallow trench isolation method of claim 1 wherein each dummy is formed at the bottom of each of the first-type trenches.

7. The shallow trench isolation method of claim 1 wherein each component on the semiconductor wafer surface comprises a Si substrate, a pad oxide layer above the Si substrate, and a pad nitride layer above the pad oxide layer, and the planarization process performed on the dielectric layer surface makes this surface inside each of the first-type trenches and the second-type trenches align approximately with the pad nitride layer of each component on the semiconductor wafer surface; wherein the shallow trench isolation method further comprises:

performing a second planarization process to strip off the pad oxide layer and pad nitride layer from each component, and make the surface of the dielectric layer inside each of the first-type trenches and the second-type trenches approximately align with the surface of the Si substrate of each component.

8. The shallow trench isolation method of claim 5 wherein the dielectric layer is deposited on the surface of the semiconductor wafer by using a chemical vapor deposition process and the dielectric layer comprises $Si(OC_2H_5)_4$ (tetra-ethyl-ortho-silicate, TEOS) in it.

9. The shallow trench isolation method of claim 7 wherein the bottom of each of the first-type trenches and the second-type trenches on the semiconductor wafer is formed by a Si substrate, and each dummy is also made of Si.

10. The shallow trench isolation method of claim 9 wherein after the second planarization process, the dielectric material formed in each of the first-type trenches remains covered over each Si dummy for electrical isolation.

11. The shallow trench isolation method of claim 7 wherein the second planarization process is an etch process.

12. The shallow trench isolation method of claim 7 wherein the pad oxide layer and pad nitride layer are used as a mask or a sacrificial layer during a previous ion implantation or heat diffusion process.

* * * * *